United States Patent
Heo et al.

(10) Patent No.: US 10,102,813 B2
(45) Date of Patent: Oct. 16, 2018

(54) ARRAY SUBSTRATE AND DISPLAY DEVICE INCLUDING THE SAME

(71) Applicant: LG Display Co., Ltd., Seoul (KR)

(72) Inventors: SeoungUk Heo, Paju-si (KR); Sahnglk Jun, Seoul (KR); Kyeusang Yoon, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 15/394,120

(22) Filed: Dec. 29, 2016

(65) Prior Publication Data
US 2017/0193914 A1 Jul. 6, 2017

(30) Foreign Application Priority Data

Dec. 31, 2015 (KR) .................. 10-2015-0191139

(51) Int. Cl.
| | | |
|---|---|---|
| *G09G 5/00* | (2006.01) | |
| *G09G 3/36* | (2006.01) | |
| *H01L 51/52* | (2006.01) | |
| *H01L 27/32* | (2006.01) | |

(52) U.S. Cl.
CPC ... *G09G 3/3611* (2013.01); *G09G 2300/0408* (2013.01); *G09G 2300/0426* (2013.01); *G09G 2320/0219* (2013.01); *G09G 2320/0223* (2013.01); *H01L 27/3276* (2013.01); *H01L 51/52* (2013.01)

(58) Field of Classification Search
CPC .. G09G 3/3258; G09G 3/3266; G09G 3/3275; G09G 3/3677; G09G 3/3688
USPC .................. 345/92, 174, 205–212; 313/512; 362/610
See application file for complete search history.

(56) References Cited

U.S. PATENT DOCUMENTS

| | | |
|---|---|---|
| 2004/0256966 A1 | 12/2004 | Su et al. |
| 2008/0013029 A1* | 1/2008 | Kim ............... G02F 1/1345 349/150 |
| 2010/0102719 A1* | 4/2010 | Lee ............... H01L 51/5246 313/512 |
| 2010/0141570 A1 | 6/2010 | Horiuchi et al. |

(Continued)

FOREIGN PATENT DOCUMENTS

| | | |
|---|---|---|
| KR | 10-2009-0005651 A | 1/2009 |
| KR | 10-2015-0025774 A | 3/2015 |
| TW | 200500705 A | 1/2005 |

OTHER PUBLICATIONS

Taiwanese Office Action and Search Report dated Aug. 10, 2017 in Taiwanese Patent Application No. 105143443.

*Primary Examiner* — Prabodh M Dharia
(74) *Attorney, Agent, or Firm* — Polsinelli PC

(57) ABSTRACT

An array substrate of a display device includes an active area with curved corner portions and a compensation unit to reduce a difference in a parasitic capacitance of each gate line and each data line. Also, a plurality of data lines disposed to overlap the corner portions of the active area may be disposed with a different width therebetween to reduce a difference in parasitic capacitance of each gate line or data line disposed to overlap the corner portions of the active area and to reduce a resistance difference between data lines. Therefore, a degree of delay of a signal transferred through a plurality of gate lines or data lines can be similar in each gate line or data line, so that a defect can be prevented in a displayed image.

20 Claims, 5 Drawing Sheets

(56) References Cited

U.S. PATENT DOCUMENTS

| | | | |
|---|---|---|---|
| 2011/0134104 A1* | 6/2011 | Yoon | G09G 3/3677 345/212 |
| 2012/0194494 A1* | 8/2012 | Jung | G02F 1/133723 345/208 |
| 2012/0218219 A1* | 8/2012 | Rappoport | H01L 27/3276 345/174 |
| 2014/0266990 A1* | 9/2014 | Makino | G02B 27/017 345/8 |
| 2015/0002382 A1* | 1/2015 | Cao | G09G 3/3677 345/92 |
| 2015/0253487 A1* | 9/2015 | Nichol | G02B 6/0036 362/610 |
| 2015/0317019 A1* | 11/2015 | Lee | G06F 3/044 345/174 |
| 2015/0325197 A1* | 11/2015 | Hong | G09G 5/18 345/205 |
| 2015/0342723 A1* | 12/2015 | Abramson | A61F 2/141 623/6.64 |
| 2016/0035307 A1* | 2/2016 | Jeon | H01L 27/124 345/211 |
| 2017/0146850 A1* | 5/2017 | Lee | G02F 1/133308 |
| 2017/0219895 A1* | 8/2017 | Yu | G02F 1/13454 |

\* cited by examiner

Background

ARRAY SUBSTRATE AND DISPLAY DEVICE INCLUDING THE SAME

CROSS-REFERENCE TO RELATED APPLICATION

This application claims the priority of Korean Patent Application No. 10-2015-0191139 filed in the Republic of Korea on Dec. 31, 2015, which is incorporated herein by reference in its entirety.

BACKGROUND

Field of the Disclosure

The present disclosure relates to a display device, and more particularly, to an array substrate and a display device including the same. Although the present disclosure is suitable for a wide scope of applications, it is particularly suitable for compensating for a parasitic capacitance between a gate line and a data line and a resistance of the data line, so that the quality of an image of a display device having curve-shape corners can be improved.

Description of the Background

With the advancement of various portable electronic devices such as mobile phones and notebook computers, demand for Flat Panel Display (FPD) devices applicable to the portable electronic devices is increasing.

An liquid crystal display (LCD), a plasma display panel (PDP), a field emission display (FED), and an organic light emitting diode display (OLED) are actively researched as flat panel display (FPD) devices.

A display device such as an LCD device and an OLED device includes an array substrate including a thin film transistor (TFT) as an essential component. Specifically, the LCD device includes an array substrate, a color filter substrate facing the array substrate, and a liquid crystal layer formed between the two substrates. The OLED device includes an array substrate and an emission layer formed on the array substrate.

The array substrate includes a plurality of lines and a plurality of links for connecting the plurality of lines to a driving circuit. A related art array substrate will be described below with reference to the accompanying drawing.

FIG. 1 is a schematic plan view of the related art array substrate.

On an array substrate 1, a plurality of pixels 2 is defined by a plurality of gate lines GL and a plurality of data lines DL intersecting with each other. A pixel electrode 3 and a common electrode 4 are disposed on each of the plurality of pixels 2. The array substrate 1 includes a power supply unit (not illustrated) that converts a voltage input from the outside and outputs a plurality of supply voltages and a common voltage line 5 that supplies a common voltage Vcom of the power supply unit to the common electrode 4. Further, the array substrate 1 includes an active area AA where an image is displayed and a non-active area NA where a gate driving circuit unit 11 and a data pad 13 are disposed as a non-active area.

A data driving circuit unit (not illustrated) may be disposed on a Printed circuit Board (PCB) or a Chip on Film (COF) and connected to the data pad 13 through a Flexible Printed Circuit (FPC). The data pad 13 may be connected to the data lines DL through data link lines 14. The data driving circuit unit supplies a data voltage to the data lines DL through the data pad 13 and the data link lines 14.

The gate driving circuit unit (i.e., gate-in-panel) 11 sequentially supplies a scan signal (gate driving signal) for turning on a thin film transistor (TFT) formed on each pixel to each of the plurality of gate lines. Thus, the pixels on the array substrate 1 are sequentially driven. To this end, the gate driving circuit unit 11 includes a plurality of circuit blocks 12 each including a shift register and a level shifter configured to convert an output signal of the shift register into a swing width suitable for driving the TFT. Herein, a gate-in-panel (GIP)-type display device in which a thin film transistor (TFT) using amorphous silicon (a-Si) is disposed on a lower substrate (or array substrate) of the array substrate 1 and the gate driving circuit unit 11 is integrated into a display panel, i.e., the gate driving circuit unit 11 is embedded in the display panel, is employed. In this case, the gate driving circuit unit 11 may be disposed in a GIP manner on the left and right sides of the non-active area NA of the array substrate.

Unlike a display device including a rectangular screen as illustrated in FIG. 1, a display device including a screen with curved corner portions for design differentiation is being researched. In a display device, particularly a GIP-type display device, including a screen with curved corner portions unlike a display device including a rectangular screen, circuit blocks of a gate driving circuit unit are disposed corresponding to a curved shape at each corner portion of an array substrate. Accordingly, there is a change in the number of pixels which are respectively disposed on a plurality of gate lines of the display device including a screen with curved corner portions and can cause parasitic capacitances. Further, in the display device including a screen with curved corner portions unlike the display device including a rectangular screen, data lines disposed at each corner portion of the array substrate have different lengths.

Therefore, a parasitic capacitance generated at each gate line GL or each data line DL and a line resistance generated at each data line DL are different in each line. That is, a degree of delay of a signal transferred to each pixel 2 through the gate line GL is different in each gate line GL, so that a defect occurs in a displayed image. Further, a degree of delay of a data signal transferred to each pixel 2 through the data line DL is different for in data line DL, so that a defect occurs in a displayed image.

SUMMARY

Accordingly, the present disclosure is directed to an array substrate and a display device including the same that substantially obviate one or more problems due to limitations and disadvantages as described the above.

An object to be achieved by the present disclosure is to provide a GIP-type liquid crystal display device which includes a screen with curved corner portions and in which the quality of a displayed image is improved by reducing a parasitic capacitance difference of each gate line or each data line and a resistance difference of a data line.

According to an aspect of the present disclosure, there is provided an array substrate. The array substrate includes an active area which includes a first area with curved corner portions, a second area adjacent to the first area, and a third area adjacent to the first area and spaced from the second area and in which pixels are disposed at areas defined by intersection between a plurality of gate lines and a plurality of data lines, a first gate driving circuit unit disposed in a non-active area and including a plurality of circuit blocks including a first circuit block group configured to sequentially supply a scan signal to the gate lines in the active area and disposed in a curve shape corresponding to the first area and a second circuit block group disposed corresponding to the second area, a plurality of data link lines disposed in the non-active area and including a first link line group disposed to be connected to the plurality of data lines and disposed corresponding to the first area and a second link line group disposed corresponding to the third area, and a first compensation unit disposed in the non-active area and disposed at intersections between a plurality of gate lines extended from the first circuit block group and a plurality of data lines extended from the first link line group to provide a parasitic capacitance to the plurality of gate lines extended from the first circuit block group and the plurality of data lines extended from the first link line group. Therefore, according to the present disclosure, it is possible to reduce a difference in parasitic capacitance of each gate line or data line disposed as being overlapped with a corner portion of an active area in a display device including a screen with curved corner portions.

According to another exemplary embodiment of the present disclosure, in the array substrate, a width of the plurality of data lines extended from the first link line group may be greater than a width of a plurality of data lines extended from the second link line group. Therefore, according to the present disclosure, a resistance difference is reduced in a plurality of data lines disposed as being overlapped with curved corner portions of the active area as compared with data lines disposed on the inner side.

According to the present disclosure, it is possible to reduce a difference in parasitic capacitance of each gate line or data line disposed as being overlapped with a corner portion of an active area in a display device including a screen with curved corner portions.

Further, according to the present disclosure, a resistance difference is reduced in a plurality of data lines disposed as being overlapped with curved corner portions of the active area as compared with data lines disposed on the inner side.

Furthermore, according to the present disclosure, a degree of delay of a signal transferred through a plurality of gate lines or data lines is similar in each gate line or data line, so that a defect does not occur in a displayed image.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
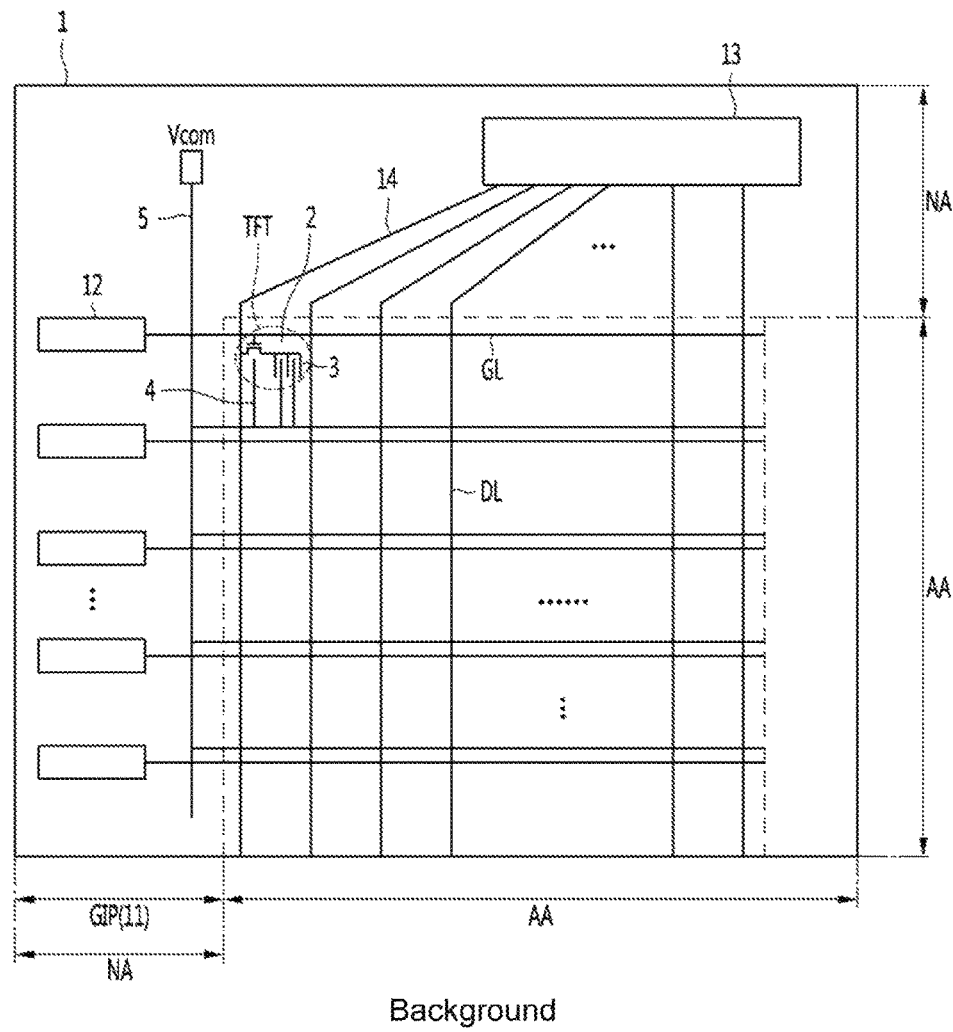
FIG. 1 is a schematic plan view of the conventional array substrate.

The aspects introduced hereinafter are provided as examples in order to convey their spirits to a person having ordinary skill in the art. Therefore, the present disclosure is not limited to the following aspects and can be embodied in a different form. Like reference numerals generally denote like elements throughout the present specification.

Advantages and features of the present disclosure, and methods for accomplishing the same will be more clearly understood from aspects described below with reference to the accompanying drawings. However, the present disclosure is not limited to the following aspects but may be implemented in various different forms. The aspects are provided only to complete disclosure of the present disclosure and to fully provide a person having ordinary skill in the art to which the present disclosure pertains with the category of the disclosure. Further, the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", and "upper" may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

The terms used herein are provided only for illustration of the exemplary embodiments but not intended to limit the present disclosure. As used herein, the singular terms include the plural reference unless the context clearly indicates otherwise. The terms "comprises" and/or "comprising" specify the presence of stated components, steps, operations, and/or elements, but do not preclude the presence or addition of one or more other components, steps, operations, and/or elements.

Figure 2:
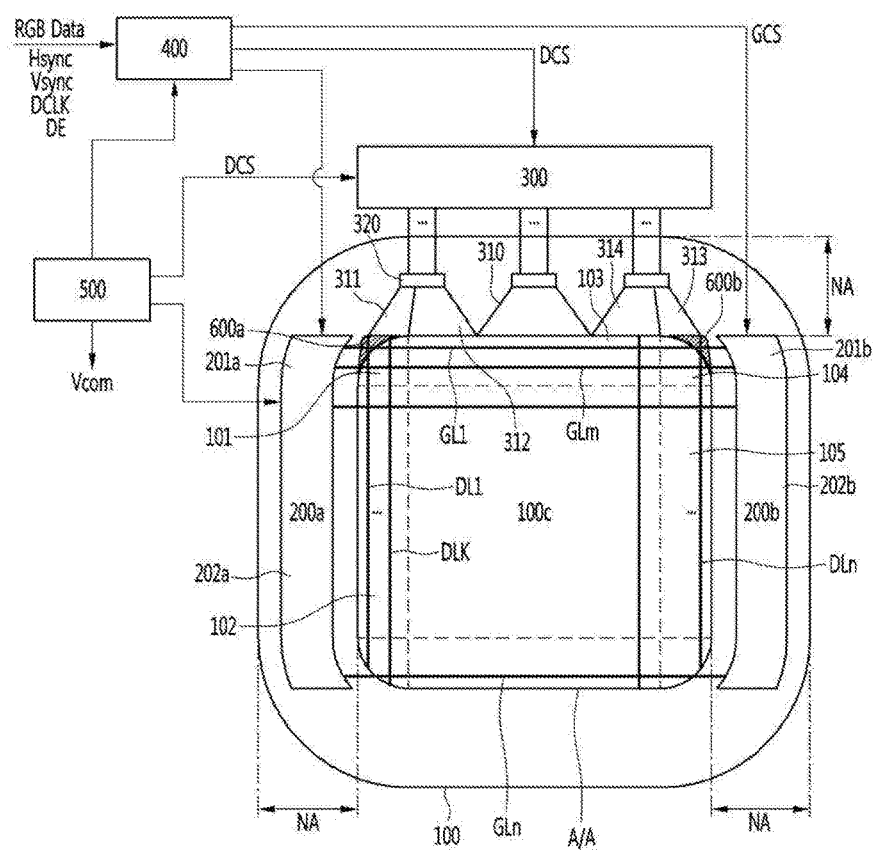
FIG. 2 is a diagram schematically illustrating a display device according to an aspect of the present disclosure.
Figure 3:
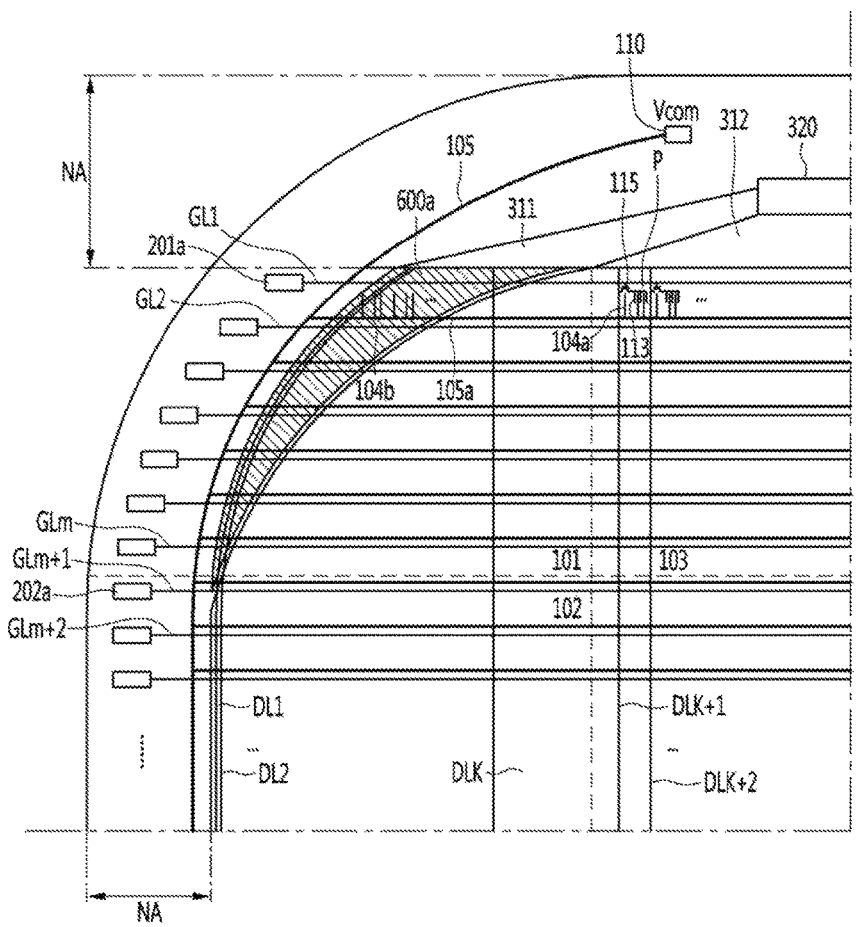
FIG. 3 is a plan view illustrating an array substrate according to an aspect of the present disclosure.

FIG. 2 is a diagram schematically illustrating a display device according to an aspect of the present disclosure, and FIG. 3 is a plan view illustrating an array substrate according to an aspect of the present disclosure.

For convenience in explanation, although a display panel of a display device includes both an upper substrate and a lower substrate, FIG. 2 illustrates only an array substrate including a thin film transistor (TFT) as a lower substrate.

An array substrate 100 illustrated in FIG. 2 has curved corner portions, but the present disclosure is not limited thereto. The array substrate 100 according to the present disclosure may have various shapes, such as a half circle or a circle, within the scope of the present disclosure.

A display device of the present disclosure includes the array substrate 100 on which pixels are aligned in a matrix form and a driving unit for driving the array substrate 100.

The array substrate 100 includes an active area A/A where an image is displayed and a non-active area NA where a gate driving circuit unit including first and second gate driving circuit units 200a and 200b, a data pad 320, and a data link line 310 are disposed. Further, the array substrate 100 includes a power supply unit 500 configured to convert a voltage input from the outside and output a plurality of supply voltages. On the array substrate 100, gate lines GL1 to GLn and data lines DL1 to DLm intersect with each other in a matrix form and a plurality of pixels (P shown in FIG. 3) are defined at the intersections. All of the pixels P constitute one active area A/A. The active area A/A has a rectangular shape with curved corner portions. Further, the active area A/A includes a central area 100c and first to fifth areas 101 to 105 as outer peripheral areas of the central area 100c. The central area 100c is located at the center of the active area A/A and has a rectangular shape with straight corner portions. The first area 101 is adjacent to one corner of the central area 100c and has a fan shape. That is, the first area 101 has a curved corner portion and is adjacent to the second area 102. The second area 102 is located outside the central area 100c and adjacent to the first gate driving circuit 200a and has a rectangular shape with straight corner portions. Further, the second area 102 is adjacent to the first area 101 and spaced apart from the third area 103. The third area 103 is located outside the central area 100c and adjacent to the data link line 310 and has a rectangular shape with straight corner portions. Further, the third area 103 is adjacent to the first area 101 and spaced apart from the second area 102. The fourth area 104 is adjacent to another corner of the central area 100c and has a fan shape. That is, the fourth area 104 is adjacent to the third area 103 and has a curved corner portion. The fifth area 105 is located outside the central area 100c and adjacent to the second gate driving circuit 200b and has a rectangular shape with straight corner portions. Further, the fifth area 105 is adjacent to the fourth area 104 and spaced apart from the third area. Furthermore, the array substrate 100 may include first and second compensation units 600a and 600b configured to reduce a difference in parasitic capacitance between the plurality of gate lines and the plurality of data lines.

The driving unit includes a timing controller 400, a data driving circuit unit 300, and a gate driving circuit unit. The timing controller 400 may receive timing signals from an external system to generate various control signals. The data driving circuit unit 300 and the gate driving circuit unit may control the array substrate 100 in response to the control signals.

The timing controller 400 receives timing signals such as an image signal (RGB), a clock signal (DCLK), a horizontal synchronization signal (Hsync), a vertical synchronization signal (Vsync), and a data enable signal (DE) from the external system to generate control signals for the data driving circuit unit 300 and the gate driving circuit unit.

Herein, the horizontal synchronization signal Hsync is a signal indicating a time required to display one horizontal line on the screen, and the vertical synchronization signal Vsync is a signal indicating a time required to display one frame on the screen. Further, the data enable signal DE is a signal indicating a period for supplying a data voltage to a pixel P defined on the array substrate 100.

Also, in the meanwhile, the timing controller 400 is designed to be connected to the external system through a predetermined interface and receive signals related to an image and timing signals output from the external system at a high speed without noise. The interface may include a Low Voltage Differential Signal (LVDS) interface or a Transistor-Transistor Logic (TTL) interface.

Further, the timing controller 400 generates a control signal DCS for the data driving circuit unit 300 and a control signal GCS for the gate driving circuit unit in synchronization with timing signals input thereto.

Besides, the timing controller 400 generates a plurality of clock signals DCLK used to determine a driving timing of each stage of the gate driving circuit unit, and supplies the plurality of clock signals to the gate driving circuit unit. Further, the timing controller 400 aligns and modulates image data RGB DATA input thereto into a form that can be processed by the data driving circuit unit 300 and outputs the modulated image data. Herein, the aligned image data may have a form to which a color coordinate correction algorithm has been applied. Further, the control signal GCS for the gate driving circuit unit may include a Gate Start Pulse, a Gate Shift Clock, a Gate Output Enable, and the like.

Next, the data driving circuit unit 300 may be formed on a Printed Circuit Board (PCB) or a Chip on Film (COF) and connected to a data pad 320 disposed on the array substrate 100 through a Flexible Printed Circuit (FPC). The data driving circuit unit 300 generates a sampling signal by shifting a Source Start Pulse SSP input from the timing controller 400 according to a Source Shift Clock SSC. Then, the data driving circuit unit 300 converts image data input according to the source shift clock SSC into a data signal by latching the image data according to the sampling signal. Then, the data driving circuit unit 300 supplies the data signal to the data lines DL on each horizontal line through the data pad 320 and the data link line 310 in response to a Source Output Enable (SOE) signal. To this end, the data driving circuit unit 300 may include a data sampling unit, a latch unit, a digital-analog converter, and an output buffer.

A plurality of data link lines 310 is disposed in the non-active area NA so as to be connected to the plurality of data lines DL1 to DLm and the data pad 320. Further, the plurality of data link lines 310 includes a first link line group 311 disposed corresponding to the first area 101 and a second link line group 312 adjacent to the first area 101 and disposed corresponding to the third area 103. That is, the first link line group 311 is disposed to be connected to data lines DL1 to DLK disposed in the first area 101 having a curved corner portion in the active area A/A. The second link line group 312 is disposed to be connected to data lines DLK+1, and the like, in a central portion of the active area A/A. Further, the plurality of data link lines 310 includes a third link line group 313 disposed corresponding to the fourth area 104 and a fourth link line group 314 adjacent to the fourth area 104 and disposed corresponding to the third area 103. That is, the third link line group 313 is disposed to be connected to data lines DLn, and the like, disposed in the fourth area 104 having a curved corner portion in the active area A/A. The fourth link line group 314 is disposed to be connected to the data lines in the central portion of the active area A/A.

The gate driving circuit unit sequentially supplies a scan signal (gate driving signal) for turning on a thin film transistor 115 formed on each pixel P to each of the plurality of gate lines GL. Thus, the pixels P on the array substrate 100 are sequentially driven. To this end, the gate driving circuit unit includes a plurality of circuit blocks 201a and 202a in FIG. 3 each including a shift register and a level shifter configured to convert an output signal of the shift register into a swing width suitable for driving the thin film transistor 115. A gate-in-panel (GIP)-type display device in which the thin film transistor 115 using amorphous silicon (a-Si) is disposed on the array substrate 100 and the gate driving circuit unit is integrated into the display panel, i.e., the gate driving circuit unit is embedded in the display panel, is employed. Herein, the gate driving circuit unit may be disposed in a GIP manner on the left and right sides of the non-active area NA of the array substrate. That is, the gate driving circuit unit may include the first gate driving circuit 200a disposed on one side of the non-active area NA and the second gate driving circuit 200b disposed on the other side of the non-active area NA.

The first gate driving circuit 200a includes a first circuit block group 201a disposed in a curve shape corresponding to the first area 101 and a second circuit block group 202a disposed in a straight-line shape corresponding to the second area 102. That is, the first circuit block group 201a may be disposed in a curve shape corresponding to the first area 101 having curved corner portions in the active area. The second circuit block group 202a may be disposed in a straight-line shape as disposed in a general display device. Likewise, the second gate driving circuit unit 200b may include a third circuit block group 201b disposed in a curve shape corresponding to the fourth area 104 and a fourth circuit block group 202b disposed in a straight-line shape corresponding to the fifth area 105.

FIG. 3 is an enlarged plan view of the array substrate 100 provided to explain a first compensation unit 600a. The following descriptions about the first compensation unit 600a can be applicable to a second compensation unit 600b which is not illustrated herein.

The first compensation unit 600a is disposed in the non-active area NA. The first compensation unit 600a is disposed at intersections between a plurality of gate lines GL1 to GLm extended from the first circuit block group 201a and a plurality of data lines DL1 to DLk extended from the first link line group 311. More specifically, the first compensation unit 600a may be disposed in a curve shape corresponding to the first area 101. That is, the first compensation unit 600a may be disposed in the non-active area between the first circuit block group 201 and the first area 101 of the active area A/A. Further, the first compensation unit 600a may be disposed in the non-active area between the first link line group 311 and the first area 101 of the active area A/A. The first compensation unit 600a may supply a parasitic capacitance to the plurality of gate lines GL1 to GLm extended from the first circuit block group 201a and the plurality of data lines DL1 to DLk extended from the first link line group 311. Therefore, according to the present disclosure, it is possible to reduce a difference in parasitic capacitance of each gate line or data line disposed to overlap a corner portion of an active area in a display device including a screen with curved corner portions.

The supply of a parasitic capacitance to the plurality of gate lines GL1 to GLm extended from the first circuit block group 201a and the plurality of data lines DL1 to DLk extended from the first link line group 311 by the first compensation unit 600a will be described in detail.

Each pixel P is provided with a pixel electrode 113 and a common electrode 104a. The common electrode 104a is disposed alternately with the pixel electrode 113.

The common electrode 104a is supplied with a common voltage Vcom from a common line 105a branched from a common voltage line 105. The common voltage line 105 is disposed along an edge of the array substrate 100 so as to overlapping an end of the gate line GL or data line DL. Herein, the common voltage line 105 is supplied with the common voltage Vcom from a common voltage terminal 110, and the common voltage terminal 110 is supplied with the common voltage Vcom from a power supply unit 500.

As for the plurality of gate lines GL1 to GLm extended from the first circuit block group 201a, the number of pixels P disposed on each gate line is decreased unlike the rectangular display device. Therefore, in each of the plurality of gate lines GL1 to GLm extended from the first circuit block group 201a, the common electrode 104a and the like making a voltage difference are disposed differently, so that a difference in parasitic capacitance can be caused. To solve this problem, in the present disclosure, a compensation electrode 104b is disposed in the first compensation unit 600a overlapping the plurality of gate lines GL1 to GLm extended from the first circuit block group 201a. Thus, the common voltage Vcom is supplied from the common line 105a branched from the common voltage line 105. Therefore, the first compensation unit 600a can supply a parasitic capacitance to the plurality of gate lines GL1 to GLm having a relatively small parasitic capacitance, and a difference in parasitic capacitance between the gate lines can be reduced.

As for the plurality of data lines DL1 to DLk extended from the first link line group 311, the number of pixels P disposed on each data line is decreased and each data line has a different length unlike the rectangular display device. Further, if the plurality of data lines DL1 to DLk extended from the first link line group 311 is disposed corresponding to the curved first area 101, the data lines DL1 to DLk may be disposed with a small space therebetween. Data lines DL1, DL2, and the like, disposed on the inner side from among the plurality of data lines DL1 to DLk extended from the first link line group 311 may have a greater length than the other data lines. Thus, the data lines DL1, DL2, and the like, may have a large parasitic capacitance. On data lines (for example, DLK−1 and DLK) disposed on the inner side from among the plurality of data lines DL1 to DLk extended from the first link line group 311, a smaller number of the common electrodes 104a and the like making a voltage difference, as compared with the other data lines. Thus, the data lines (for example, DLK−1 and DLK) may have a small parasitic capacitance. To this solve this problem, in the present disclosure, the compensation electrode 104b is disposed in the first compensation unit 600a overlapping the plurality of data lines DL1 to DLk extended from the first link line group 311. Thus, the common voltage Vcom is supplied from the common line 105a branched from the common voltage line 105. Therefore, the first compensation unit 600a can supply a parasitic capacitance to the plurality of data lines DL1 to DLk having a relatively small parasitic capacitance, and a difference in parasitic capacitance between the data lines can be reduced.

Likewise, the second compensation unit 600b may be disposed in the non-active area NA. The second compensation unit 600b may be disposed at intersections between a plurality of gate lines GL1 to GLm extended from the third circuit block group 201b and a plurality of data lines DLn, and the like, extended from the third link line group 313. Further, the second compensation unit 600b may supply a parasitic capacitance to the plurality of gate lines GL1 to GLm extended from the third circuit block group 201b and the plurality of data lines DLn, and the like, extended from the third link line group 313. Therefore, according to the present disclosure, it is possible to reduce a difference in parasitic capacitance of each gate line or data line disposed to overlap a corner portion of an active area A/A in a display device including a screen with curved corner portions.

Further, the compensation electrode 104b may be formed of the same material and the same shape as the common electrode 104b disposed on each of the pixels P. That is, the compensation electrode 104b may be disposed through the same process as the common electrode 104b. Therefore, according to the present disclosure, it is possible reduce a difference in parasitic capacitance between gate lines and data lines without an additional process or material.

Therefore, according to the present disclosure, a degree of delay of a signal transferred through a plurality of gate lines or data lines is similar in each gate line or data line, so that a defect does not occur in a displayed image.

Figure 4:
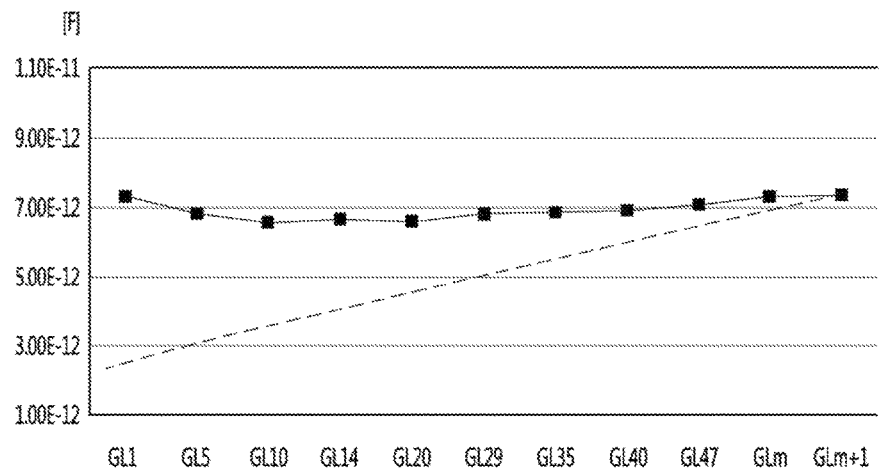
FIG. 4 illustrates parasitic capacitances of gate lines according to an aspect of the present disclosure.
Figure 5:
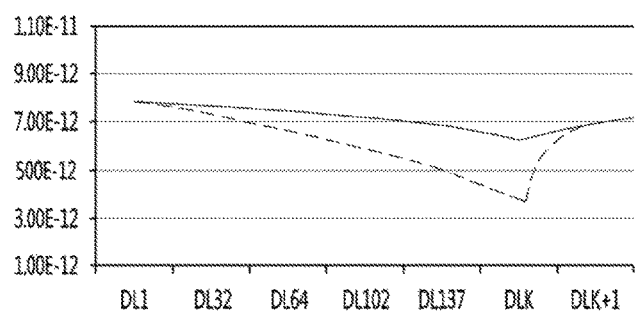
FIG. 5 illustrates parasitic capacitances of data lines according to an aspect of the present disclosure.

FIG. 4 illustrates parasitic capacitances of gate lines according to an aspect of the present disclosure, and FIG. 5 illustrates parasitic capacitances of data lines according to an aspect of the present disclosure.

FIG. 4 illustrates that a difference in parasitic capacitance between gate lines is reduced. A dotted line indicates parasitic capacitances of gate lines in a conventional curved display device. A solid line indicates parasitic capacitances of gate lines in a curved display device of the present disclosure.

In the conventional curved display device, a smaller number of components, such as a common electrode, making a voltage difference are disposed on a plurality of gate lines GL1 to GLm disposed to overlap the curved corner portions of an active area. Therefore, the overlapped gate lines of the conventional curved display device have a smaller parasitic capacitance than the other non-overlapped gate lines.

In the display device of the present disclosure, a plurality of gate lines GL1 to GLm disposed to overlap the curved corner portions of an active area is supplied with a parasitic capacitance from the compensation electrode 104b of the first compensation unit 600a. Therefore, in the display device of the present disclosure, a difference in parasitic capacitance can be reduced between the plurality of gate lines GL1 to GLm disposed to overlap the curved corner portions of the active area and the other gate lines GLm+1, and the like.

Therefore, according to the present disclosure, a degree of delay of a signal transferred through a plurality of gate lines or data lines is similar in each gate line or data line, so that a defect does not occur in a displayed image.

FIG. 5 illustrates that a difference in parasitic capacitance between data lines is reduced. A dotted line indicates parasitic capacitances of data lines in the conventional curved display device. A solid line indicates parasitic capacitances of data lines in the curved display device of the present disclosure.

In the conventional curved display device, a smaller number of components, such as a common electrode, making a voltage difference are disposed on a plurality of data lines disposed to overlap the curved corner portions of the active area. Therefore, the overlapped data lines of the conventional curved display device have a smaller parasitic capacitance than the other data lines disposed on the inner side. Further, data lines (for example, DL1 and DL2) disposed on the outer side from among the plurality of data lines disposed to overlap the curved corner portions of the active area have a greater length than the other data lines. Thus, they may have a large parasitic capacitance due to a voltage difference between adjacent lines.

In the display device of the present disclosure, a plurality of data lines DL1 to DLk disposed to overlap the curved corner portions of the active area is supplied with a parasitic capacitance from the compensation electrode 104b of the first compensation unit 600a. Particularly, the last data line DLk from among the data lines overlapping the curved corner portions can be compensated with the most parasitic capacitance. That is, the last data line DLk has the largest area overlapping the first compensation unit 600 and thus can be compensated with the most parasitic capacitance. Therefore, in the display device of the present disclosure, a difference in parasitic capacitance is reduced between the plurality of data lines DL1 to DLk disposed to overlap the curved corner portions of the active area and the other data lines DLk+1, and the like.

Therefore, according to the present disclosure, a degree of delay of a signal transferred through a plurality of gate lines or data lines is similar in each gate line or data line, so that a defect does not occur in a displayed image.

Figure 6:
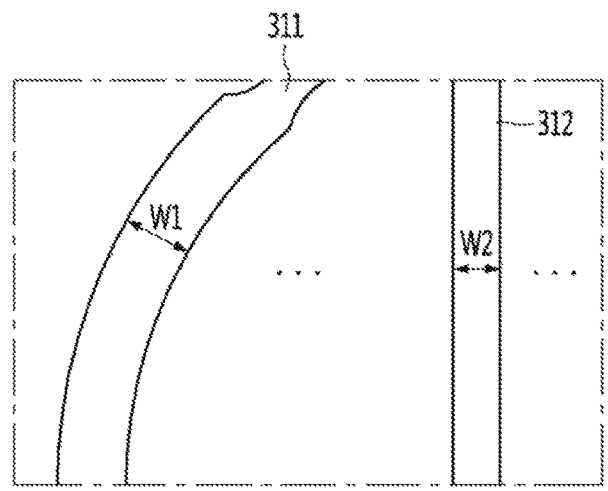
FIG. 6 illustrates line widths of data lines according to another aspect of the present disclosure.

FIG. 6 illustrates line widths of data lines according to another aspect of the present disclosure.

In the conventional curved display device, a plurality of data lines disposed to overlap the curved corner portions of the active area has a greater length and thus has a greater resistance than the other non-overlapped data lines.

Referring to FIG. 6, in another aspect of the present disclosure, a width W1 of the plurality of data lines DL1 to DLk extended from the first link line group 311 may be greater than a width W2 of a plurality of data lines DLk+1, and the like, extended from the second link line group 312. Therefore, a plurality of data lines disposed to overlap the curved corner portions of the active area has a greater length and a greater width than the data lines disposed on the inner side, and, thus, a resistance difference can be reduced.

Further, in yet another aspect of the present disclosure, each of the plurality of data lines DL1 to DLk extended from the first link line group 311 has a different length. Therefore, the plurality of data lines DL1 to DLk extended from the first link line group 311 is disposed with a different line width therebetween so as to have a resistance equal to that of the plurality of data lines DLk+1, and the like, extended from the second link line group 312. Thus, the plurality of data lines DL1 to DLk extended from the first link line group 311 may have a resistance equal to that of the plurality of data lines DLk+1, and the like, extended from the second link line group 312.

Therefore, according to the present disclosure, a degree of delay of a signal transferred through a plurality of gate lines or data lines is similar in each gate line or data line, so that a defect does not occur in a displayed image.

Figure 7:
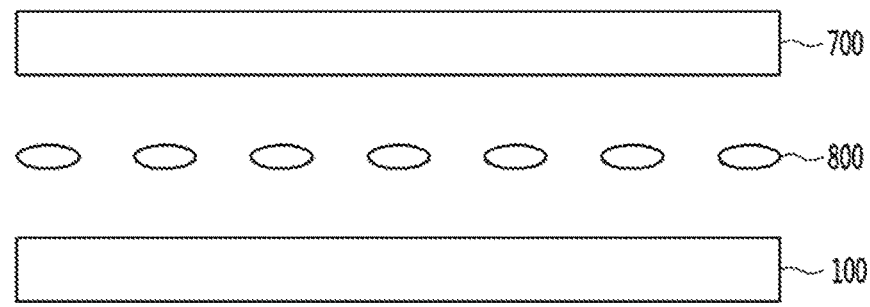
FIG. 7 is a schematic diagram of a liquid crystal display device to which an array substrate applied with the present disclosure.

FIG. 7 is a schematic diagram of a liquid crystal display device to which an array substrate applied with the present disclosure.

Referring to FIG. 7, a liquid crystal display device according to still another aspect of the present disclosure may include the above-described array substrate 100 of various shapes, a counter substrate 700 facing the array substrate 100, and a liquid crystal layer 800 formed between the two substrates 100 and 700. The configuration of the counter substrate 700 and the like may be modified in various forms as known in the art.

Figure 8:
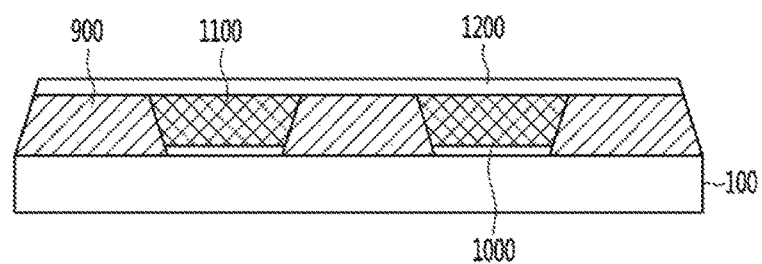
FIG. 8 is a schematic diagram of an organic light emitting diode display device to which an array substrate applied with the present disclosure.

FIG. 8 is a schematic diagram of an organic light emitting diode display device to which an array substrate applied with the present disclosure.

Referring to FIG. 8, an organic light emitting diode display device according to still another aspect of the present disclosure may include the above-described array substrate 100 of various shapes, a bank layer 900 formed on the array substrate 100 so as to define an emission area, a first electrode 1000 and an organic emission layer 1100 formed in sequence within the emission area defined by the bank layer 900, and a second electrode 1200. The configuration of the bank layer 900, the first electrode 1000, the organic emission layer 1100, the second electrode 1200, and the like may be modified in various forms as known in the art.

The aspects of the present disclosure can also be described as follows:

According to an aspect of the present disclosure, there is provided an array substrate. The array substrate includes an active area which includes a first area with curved corner portions, a second area adjacent to the first area, and a third area adjacent to the first area and spaced from the second area and in which pixels are disposed at areas defined by intersection between a plurality of gate lines and a plurality of data lines, a first gate driving circuit unit disposed in a non-active area and including a plurality of circuit blocks including a first circuit block group configured to sequentially supply a scan signal to the gate lines in the active area and disposed in a curve shape corresponding to the first area and a second circuit block group disposed corresponding to the second area, a plurality of data link lines disposed in the non-active area and including a first link line group disposed to be connected to the plurality of data lines and disposed corresponding to the first area and a second link line group disposed corresponding to the third area, and a first compensation unit disposed in the non-active area and disposed at intersections between a plurality of gate lines extended from the first circuit block group and a plurality of data lines extended from the first link line group to supply a parasitic capacitance to the plurality of gate lines extended from the first circuit block group and the plurality of data lines extended from the first link line group.

According to another aspect of the present disclosure, the first compensation unit may be disposed in a curve shape corresponding to the first area.

According to yet another aspect of the present disclosure, the first compensation unit may be formed of the same material into the same shape as the common electrode disposed on each of the pixels.

According to still another aspect of the present disclosure, the active area includes a fourth area adjacent to the third area and having a curved corner portion and a fifth area adjacent to the fourth area and spaced from the third area, and the plurality of data link lines includes a third link line group disposed corresponding to the fourth area and a fourth link line group disposed corresponding to the third area. The array substrate further includes a second gate driving circuit unit disposed in the non-active area and including a plurality of circuit blocks including a third circuit block group configured to sequentially supply a scan signal to the gate lines in the active area and disposed in a curve shape corresponding to the fourth area and a fourth circuit block group disposed corresponding to the fifth area and a second compensation unit disposed in the non-active area and disposed at intersections between a plurality of gate lines extended from the third circuit block group and a plurality of data lines extended from the third link line group to supply a parasitic capacitance to the plurality of gate lines extended from the third circuit block group and the plurality of data lines extended from the third link line group.

According to still another aspect of the present disclosure, the plurality of data lines extended from the first link line group may have a resistance equal to that of a plurality of data lines extended from the second link line group.

According to still another aspect of the present disclosure, a width of the plurality of data lines extended from the first link line group may be greater than a width of a plurality of data lines extended from the second link line group.

According to another aspect of the present disclosure, there is provided a display device including an array substrate, a data driving circuit unit configured to supply a data voltage to a plurality of data link lines, a timing controller configured to supply control signals to a gate driving circuit unit and the data driving circuit unit, and a power supply unit configured to supply a common voltage to the array substrate.

The scope of the present disclosure is defined by the following claims rather than by the detailed description of the aspect of the disclosure. It shall be understood that all modifications and aspects conceived from the meaning and scope of the claims and their equivalents are included in the scope of the present disclosure.

What is claimed is:

1. An array substrate having an active area and a non-active area, comprising:
   first, second, and third areas and a plurality of pixels disposed in the active area, the first area with curved corner portions, the second area adjacent to the first area, and the third area adjacent to the first area and spaced apart from the second area, the pixels disposed where a plurality of gate lines and a plurality of data lines intersect each other;
   a first gate driving circuit unit disposed in the non-active area and having a first circuit block group configured to sequentially supply a scan signal to the gate lines and having a curve shape corresponding to the first area and a second circuit block group disposed corresponding to the second area;
   first and second link line groups disposed in the non-active area the first link line group connected to the data lines and corresponding to the first area, and the second link line group disposed corresponding to the third area; and
   a first compensation unit having a compensation electrode receiving a common voltage from a power supply unit through a curved common voltage line connected to a common voltage terminal, disposed outside the active area and disposed at intersections between a plurality of gate lines extended from the first circuit block group and a plurality of data lines extended from the first link line group to supply a first parasitic capacitance to the plurality of gate lines extended from the first circuit block group and the plurality of data lines extended from the first link line group, and reducing a difference in parasitic capacitance of each gate line or each data line.

2. The array substrate according to claim 1, wherein the first compensation unit has a curve shape corresponding to the first area.

3. The array substrate according to claim 1, wherein the compensation electrode is formed of the same material and the same shape as the common electrode disposed on each of the pixels.

4. The array substrate according to claim 1, further comprising fourth and fifth areas, the fourth area adjacent to the third area and having a curved corner portion and the fifth area adjacent to the fourth area and spaced apart from the third area.

5. The array substrate according to claim 4, further comprising a third link line group disposed corresponding to the fourth area and a fourth link line group disposed corresponding to the third area.

6. The array substrate according to claim 4, further comprising second gate driving circuit unit disposed in the non-active area and having a third circuit block group configured to sequentially supply the scan signal to the gate lines and disposed in a curve shape corresponding to the fourth area and a fourth circuit block group disposed corresponding to the fifth area.

7. The array substrate according to claim 6, further comprising a second compensation unit disposed in the non-active area and disposed at intersections between the gate lines extended from the third circuit block group and the data lines extended from the third link line group to supply a second parasitic capacitance to the gate lines extended from the third circuit block group and the data lines extended from the third link line group.

8. The array substrate according to claim 1, wherein the plurality of data lines extended from the first link line group has a resistance equal to that of a plurality of data lines extended from the second link line group.

9. The array substrate according to claim 1, wherein the plurality of data lines extended from the first link line group has a width greater than that of a plurality of data lines extended from the second link line group.

10. The array substrate according to claim 1, wherein the active area has curve shape corners.

11. A display device comprising:
a first gate driving circuit unit disposed in a non-active area, and having first and second circuit block groups, the first circuit block group configured to sequentially supply a scan signal to a plurality of gate lines in an active area having a curve shape;
first, second, third link line groups disposed in the non-active area;
a data driving circuit unit configured to supply a data voltage to the first and second data link line groups;
a timing controller configured to supply control signals to the first gate driving circuit unit and the data driving circuit unit;
a power supply unit configured to supply a common voltage to a common voltage terminal; and
a first compensation unit having a compensation electrode receiving the common voltage from the power supply unit through a curved common voltage line connected to the common voltage terminal, disposed outside the active area and disposed at intersections between the plurality of gate lines extended from the first circuit block group and a plurality of data lines extended from the first link line group to supply a first parasitic capacitance to the plurality of gate lines extended from the first circuit block group and the plurality of data lines extended from the first link line group, and compensating for a parasitic capacitance between the gate lines and the data lines and a resistance of the data lines at curve shape corners of the active area.

12. The display device according to claim 11, further comprising a second gate driving circuit unit disposed in the non-active area and having third and fourth circuit block groups, the third circuit block group configured to sequentially supply the scan signal to the gate lines and having a curve shape.

13. The display device according to claim 12, further comprising a second compensation unit disposed in the non-active area and disposed at intersections between a plurality of the gate lines extended from the third circuit block group and a plurality of data lines extended from the third link line group to supply a second parasitic capacitance to the plurality of gate lines extended from the third circuit block group and the plurality of data lines extended from the third link line group, to compensate for the parasitic capacitance between the gate lines and the data lines and the resistance of the data lines at the curve shape corners of the active area.

14. The display device according to claim 11, wherein the plurality of data lines extended from the first link line group has a resistance equal to that of a plurality of data lines extended from the second link line group.

15. The display device according to claim 11, wherein the plurality of data lines extended from the first link line group has a width greater than that of a plurality of data lines extended from the second link line group.

16. An array substrate for display device, having an active area and a non-active area, comprising:
a first gate driving circuit unit disposed in the non-active area, and having first and second circuit block groups, the first circuit block group configured to sequentially supply a scan signal to a plurality of gate lines in an active area having a curve shape; and
a first compensation unit having a compensation electrode receiving a common voltage from a power supply unit through a curved common voltage line connected to a common voltage terminal, disposed outside the active area and disposed where a plurality of gate lines extended from the first circuit block group and a plurality of data lines extended from a first link line group intersect each other, the first compensation unit to supply a first parasitic capacitance to the plurality of gate lines extended from the first circuit block group and the plurality of data lines extended from the first link line group, and compensating for a parasitic capacitance between the gate lines and the data lines and a resistance of the data lines at curve shape corners of the active area.

17. The array substrate according to claim 16, further comprising a second gate driving circuit unit disposed in the non-active area and having third and fourth circuit block groups, wherein the third circuit block group configured to sequentially supply the scan signal to the gate lines and disposed in a curve shape.

18. The array substrate according to claim 17, further comprising a second compensation unit disposed in the non-active area and disposed where a plurality of gate lines extended from the third circuit block group and a plurality of data lines extended from a third link line group intersect each other, the second compensation unit supplying a second parasitic capacitance to the plurality of gate lines extended from the third circuit block group and the plurality of data lines extended from the third link line group, to compensate for the parasitic capacitance between the gate lines and the data lines and the resistance of the data lines at the curve shape corners of the active area.

19. The display device according to claim 16, wherein the plurality of data lines extended from the first link line group has a resistance equal to that of a plurality of data lines extended from the second link line group.

20. The display device according to claim 16, wherein the plurality of data lines extended from the first link line group has a width greater than that of a plurality of data lines extended from the second link line group.

* * * * *